US012592671B2

(12) United States Patent
Gicquel et al.

(10) Patent No.: US 12,592,671 B2
(45) Date of Patent: Mar. 31, 2026

(54) AMPLIFIER FOR A RADIO FREQUENCY RECEIVER

(71) Applicants: STMicroelectronics (Alps) SAS, Grenoble (FR); STMicroelectronics (Grenoble 2) SAS, Grenoble (FR)

(72) Inventors: Hugo Gicquel, Grenoble (FR); Sandrine Nicolas, Saint Egreve (FR); Cedric Rechatin, Varces (FR); Reiner Welk, Sassenage (FR)

(73) Assignees: STMICROELECTRONICS (GRENOBLE 2) SAS, Grenoble (FR); STMICROELECTRONICS (ALPS) SAS, Grenoble (FR)

( * ) Notice: Subject to any disclaimer, the term of this patent is extended or adjusted under 35 U.S.C. 154(b) by 701 days.

(21) Appl. No.: 17/812,062

(22) Filed: Jul. 12, 2022

(65) Prior Publication Data

US 2023/0018356 A1 Jan. 19, 2023

(30) Foreign Application Priority Data

Jul. 13, 2021 (FR) ...................................... 2107598

(51) Int. Cl.
*H03F 3/193* (2006.01)

(52) U.S. Cl.
CPC ....... *H03F 3/193* (2013.01); *H03F 2200/451* (2013.01)

(58) Field of Classification Search
CPC .... H03F 3/193; H03F 2200/451; H03F 3/005; H03F 2200/144; H03F 2200/156;
(Continued)

(56) References Cited

U.S. PATENT DOCUMENTS

| 4,806,874 A | 2/1989 | Michel |
| 5,952,877 A | 9/1999 | Broome |

(Continued)

FOREIGN PATENT DOCUMENTS

| CN | 1219029 A | 6/1999 |
| CN | 101002379 A | 7/2007 |

(Continued)

OTHER PUBLICATIONS

Shiau, et al., "Low-Power Cmos Lna for 900-MHz LoRa Application Through Parallel-RC Feedback," 2017 IEEE International Meeting for Future of Electron Devices, Kansai (IMFEDK), Jun. 29-30, 2017, 2 pages.

(Continued)

*Primary Examiner* — Andrea Lindgren Baltzell
*Assistant Examiner* — Jose E Pinero
(74) *Attorney, Agent, or Firm* — Slater Matsil, LLP

(57) ABSTRACT

In an embodiment an amplifier includes a first MOS transistor having a drain connected to an output of the amplifier and a source coupled to a first node configured to receive a first power supply potential, a first capacitive element connected between an input of the amplifier and a gate of the first MOS transistor, a first current source connecting the drain of the first MOS transistor to a second node configured to receive a second power supply potential and a resistive element and a second capacitive element connected in parallel between the gate and the drain of the first MOS transistor, the resistive element including a switched capacitor.

24 Claims, 2 Drawing Sheets

(58) Field of Classification Search

CPC ......... H03F 2200/159; H03F 2200/264; H03F 2200/27; H03F 2200/42; H03F 2200/75

USPC ....................................................... 330/260

See application file for complete search history.

(56) References Cited

U.S. PATENT DOCUMENTS

| | | | | |
|---|---|---|---|---|
| 7,522,024 | B2 * | 4/2009 | Beffa | ..................... H03H 11/52 |
| | | | | 333/217 |
| 8,410,816 | B1 | 4/2013 | Liu et al. | |
| 8,633,764 | B2 * | 1/2014 | Agrawal | ............. H03F 3/45632 |
| | | | | 330/11 |
| 2008/0246538 | A1 * | 10/2008 | Beffa | ..................... H03F 1/223 |
| | | | | 327/568 |
| 2010/0026542 | A1 * | 2/2010 | Wang | ..................... H03F 3/005 |
| | | | | 327/554 |
| 2013/0278342 | A1 | 10/2013 | Yang et al. | |
| 2014/0077882 | A1 * | 3/2014 | Draxelmayr | ......... H03G 1/0094 |
| | | | | 330/278 |
| 2015/0038093 | A1 | 2/2015 | Connell et al. | |
| 2015/0318829 | A1 | 11/2015 | Astgimath | |
| 2016/0079925 | A1 | 3/2016 | Joish | |

FOREIGN PATENT DOCUMENTS

| | | |
|---|---|---|
| CN | 105024653 A | 11/2015 |
| CN | 219068166 U | 5/2023 |
| JP | 2004356931 A | 12/2004 |

OTHER PUBLICATIONS

Sang-Min Yoo et al., "A Power-Combined Switched-Capacitor Power Amplifier in 90nm CMOS", Presented at the 2011 IEEE Radio Frequency Integrated Circuits Symposium, Jun. 5-7, 2011, Baltimore, USA, Total pp. 04.

Zhao Sumei et al., "Study on Frequency-Selective Amplifier for Fluxgate Based on Switched-Capacitor", Microelectronics, vol. 41, Issue 5, pp. 632-635, Oct. 2011, Total pp. 04.

* cited by examiner

AMPLIFIER FOR A RADIO FREQUENCY RECEIVER

CROSS-REFERENCE TO RELATED APPLICATIONS

This application claims the priority of French Patent Application No. 2107598, filed on Jul. 13, 2021, which application is hereby incorporated herein by reference.

TECHNICAL FIELD

The present disclosure generally concerns electronic circuits, and more particularly amplifier circuits, also more simply called amplifiers, for example, amplifiers used in a radio frequency reception chain.

BACKGROUND

Amplifiers are implemented in many more complex systems or circuits, for example, in chains of reception of a radio frequency signal of radio frequency reception circuits or radio frequency receivers.

Known radio frequency receivers are configured to receive an amplitude-modulated radio frequency signal, for example, in all or nothing (OOK—"On-Off Keying"). To obtain the data transmitted via the amplitude modulation of the radio frequency signal, these known receivers comprise known reception chains implementing a plurality of functionalities, particularly an amplification function and a function of low-pass filtering of an envelope signal of the received radio frequency signal.

Known amplifiers, for example when they are used in a reception chain to implement the function of amplification of an envelope signal, have various disadvantages.

SUMMARY

An embodiment overcomes all or part of the disadvantages of known amplifiers, for example, known amplifiers implemented in radio frequency reception chains to amplify an envelope signal, for example, in a wake up radio (WUR) receiver or activation radio frequency receiver.

For example, an embodiment provides a bandpass amplifier, that is, an amplifier further implementing a bandpass filtering function.

For example, an embodiment provides a bandpass amplifier having a low cutoff frequency, that is, a low frequency below which the amplifier blocks frequencies, which is smaller than 500 Hz, preferably smaller than or equal to 100 Hz.

For example, an embodiment provides a bandpass amplifier having a low controllable cutoff frequency.

For example, an embodiment provides a bandpass amplifier for which a common-mode output voltage of the amplifier is set.

For example, an embodiment provides a bandpass amplifier having a power consumption decreased with respect to an association of a known amplifier and of a known bandpass filter.

For example, an embodiment provides a bandpass amplifier having a decreased bulk with respect to an association of a known amplifier and of a known bandpass filter.

For example, an embodiment provides a bandpass amplifier having a low noise as compared with an association of a known amplifier and of a known bandpass filter.

An embodiment provides an amplifier comprising: a first MOS transistor having its drain connected to an output of the amplifier and its source coupled to a first node configured to receive a first power supply potential; a first capacitive element connected between an input of the amplifier and the gate of the first MOS transistor; a first current source coupling the drain of the first MOS transistor to a second node configured to receive a second power supply potential; and a resistive element and a second capacitive element connected in parallel between the gate and the drain of the first MOS transistor, the resistive element being implemented by a switched capacitor.

According to an embodiment, the resistive element comprises: a first switch connected between the gate of the first MOS transistor and a first electrode of a third capacitive element; and a second switch connected between a second electrode of the third capacitive element and the drain of the first MOS transistor.

According to an embodiment, the first and second switches are configured to be controlled in phase with respect to each other, a switching frequency of the first and second switches determining a low cutoff frequency of the amplifier.

According to an embodiment, the resistive element further comprises: a third switch connected between the first electrode of the third capacitive element and a third node configured to receive a first bias potential; and a fourth switch connected between the second electrode of the third capacitive element and a fourth node configured to receive a second bias potential.

According to an embodiment, the third node is a gate of a second MOS transistor having a source configured to receive the first power supply potential, a drain of the second MOS transistor being connected to the third node and being coupled to the second node by a second current source.

According to an embodiment, the first and second MOS transistors and the first and second current sources are configured so that the first bias potential imposes a DC potential on the gate of the first transistor.

According to an embodiment, the first current source comprises a third MOS transistor mirror-assembled with a fourth MOS transistor, and the second current source comprises a fifth MOS transistor mirror-assembled with the fourth MOS transistor.

According to an embodiment, the amplifier comprises a circuit configured to control the first and second switches in phase opposition with respect to the third and fourth switches.

According to an embodiment, the second bias potential determines a common-mode output voltage of the amplifier.

According to an embodiment, the second bias potential is equal to half the difference between the first and second power supply potentials.

According to an embodiment, the fourth node is an intermediate node of a voltage dividing bridge connected between the first and second nodes.

An embodiment provides an amplifier comprising:
a first amplifier such as described hereabove;
an input connected to the input of the first amplifier;
a second amplifier having an input connected to the output of the first amplifier;
an output coupled, for example connected, to an output of the second amplifier,
wherein the second amplifier comprises:
a first capacitive element;
a first MOS transistor having a gate coupled of the input of the second amplifier by said first capacitive element, a source coupled, for example, connected, to one of first and second nodes of the first amplifier, and a drain coupled to the other of said first and second nodes;

a first resistive element and a second capacitive element connected in parallel between the drain and the gate of said first transistor, said first resistive element being implemented by a first switched capacitor;

a second MOS transistor having a source coupled, for example connected, to the other of said first and second nodes and a drain connected to the drain of said first MOS transistor;

a second resistive element and a second capacitive element connected in parallel between the drain and a gate of said second transistor, said second resistive element being implemented by a second switched capacitor; and a switch and third capacitive element, said third capacitive element coupling the gate of said second transistor to the switch and the switch being configured to couple said third capacitive element selectively to the other of said first and second nodes or to the input of the second amplifier.

According to an embodiment, the first switched capacitor comprises:

a first switch connected between the gate of the first MOS transistor of the second amplifier and a first electrode of a fourth capacitive element of the second amplifier;

a second switch connected between a second electrode of the third capacitive element of the second amplifier and the drain of the first MOS transistor of the second amplifier;

a third switch connected between the first electrode of the third capacitive element of the second amplifier and a third node of the second amplifier configured to receive a first bias potential of the second amplifier; and a fourth switch connected between the second electrode of the third capacitive element of the second amplifier and a fourth node of the second amplifier configured to receive a second bias potential of the second amplifier, and wherein the second switched capacitor comprises:

a first switch connected between the gate of the second MOS transistor of the second amplifier and a first electrode of a sixth capacitive element of the second amplifier;

a second switch connected between a second electrode of the sixth capacitive element of the second amplifier and the drain of the second MOS transistor of the second amplifier;

a third switch connected between the first electrode of the sixth capacitive element of the second amplifier and a fifth node of the second amplifier configured to receive a this bias potential of the second amplifier; and a fourth switch connected between the second electrode of the third capacitive element of the second amplifier and the fourth node of the second amplifier.

According to an embodiment, a frequency of control of the switches of the switched capacitor of the first amplifier is different from a frequency of control of the switches of the first and second switched capacitors of the second amplifier.

An embodiment provides a radio frequency receiver comprising an envelope detection circuit having an input coupled to an antenna of the receiver and an output coupled to the input of an amplifier such as described hereabove.

According to an embodiment, the radio frequency receiver forms a wake up radio frequency receiver, or activation radio frequency receiver.

According to an embodiment, the radio frequency receiver is configured to receive an amplitude-modulated radio frequency signal, preferably in all or nothing, for example according to a Manchester coding.

BRIEF DESCRIPTION OF THE DRAWINGS

The foregoing features and advantages, as well as others, will be described in detail in the following description of specific embodiments given by way of illustration and not limitation with reference to the accompanying drawings, in which.

DETAILED DESCRIPTION OF ILLUSTRATIVE EMBODIMENTS

Like features have been designated by like references in the various figures. In particular, the structural and/or functional features that are common among the various embodiments may have the same references and may dispose identical structural, dimensional and material properties.

For the sake of clarity, only the steps and elements that are useful for an understanding of the embodiments described herein have been illustrated and described in detail. In particular, usual radio frequency receivers, for example, wake up or activation radio frequency receivers, where an envelope signal amplifier can be implemented, have not been detailed, the described embodiments being compatible with these usual radio frequency receivers.

Unless indicated otherwise, when reference is made to two elements connected together, this signifies a direct connection without any intermediate elements other than conductors, and when reference is made to two elements coupled together, this signifies that these two elements can be connected or they can be coupled via one or more other elements.

In the following disclosure, unless otherwise specified, when reference is made to absolute positional qualifiers, such as the terms "front", "back", "top", "bottom", "left", "right", etc., or to relative positional qualifiers, such as the terms "above", "below", "upper", "lower", etc., or to qualifiers of orientation, such as "horizontal", "vertical", etc., reference is made to the orientation shown in the figures.

Unless specified otherwise, the expressions "around", "approximately", "substantially" and "in the order of" signify within 10%, and preferably within 5%.

Figure 1:
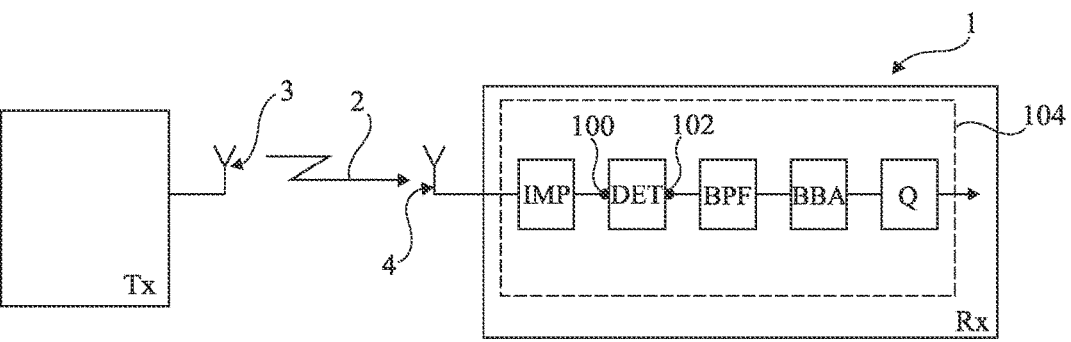
FIG. 1 schematically shows, in the form of blocks, an example of a radio frequency transmission system of the type to which the described embodiments apply.

FIG. 1 schematically shows in the form of blocks an example of a wireless radio frequency transmission system 1 of the type to which the described embodiments apply.

System 1 comprises an emitter Tx of a radio frequency signal 2 and a receiver Rx of signal 2. Radio frequency signal 2 is a wireless signal. Signal 2 for example has a frequency in the range from 100 kHz to 10 GHz. Signal 2 is amplitude-modulated, for example in all or nothing.

Emitter Tx transmits data by means of the amplitude modulation of signal 2, for example, by modulating the amplitude of signal 2 according to a Manchester coding according to the data bits to be transmitted. Signal 2 is transmitted by an antenna 3 connected to emitter Tx.

Receiver Rx is connected to an antenna 4 configured to receive signal 2. As an example, antenna 4 forms part of receiver Rx.

Receiver Rx comprises a circuit DET configured to receive an amplitude-modulated radio frequency signal and to deliver an envelope signal of the radio frequency signal that it receives, that is, a signal, for example, a voltage, having its amplitude varying with the amplitude of the envelope of the radio frequency signal received by circuit DET. In other words, circuit DET is an envelope detection circuit. Circuit DET receives the radio frequency signal on an input 100 which is coupled to antenna 4, for example by an impedance matching network IMP as shown in FIG. 1. Circuit DET delivers the envelope signal on an output 102 of circuit DET.

Impedance matching network IMP couples antenna 4 to the input 100 of circuit DET. As an example, matching network IMP is arranged outside of an integrated circuit chip comprising circuit DET. Further, although in the example of FIG. 1, only circuit IMP is arranged between antenna 4 and circuit DET, in other examples, other circuits may be connected between antenna 4 and circuit DET, for example, amplification circuits and/or bandpass filtering circuits.

The output 102 of circuit DET is coupled to an association of two circuits BPF and BBA connected one after the other, circuit BBA being connected after circuit BPF in the example of FIG. 1.

Circuit BPF, for example called baseband filter, is configured to implement a bandpass filtering function. For example, filter BPF is configured to only retain, of the envelope signal, the frequencies corresponding to the amplitude modulation frequency of signal 2.

Circuit BBA, for example, called baseband amplifier, is configured to amplify the signal that it receives and to deliver an amplified signal corresponding to a circuit Q.

Circuit Q implements a function of quantization over one bit of the signal that it receives, and thus delivers a binary signal. This binary signal for example corresponds to the Manchester coding of the data transmitted via signal 2.

A digital processing circuit, not shown in FIG. 1, receives the binary output signal of circuit Q and is configured to decode this signal, to recover the data transmitted by emitter Tx to receiver Rx.

In the example of FIG. 1, circuits IMP, DET, BPF, BBA, and Q form a radio frequency reception chain 104 of receiver Rx, that is, a chain of circuits configured, for example, to receive a radio frequency signal from antenna 4 and to deliver a digital signal corresponding to the digital processing circuit of receiver Rx, so that the processing circuit is capable of decoding the digital signal to recover the transmitted data.

There exist many other examples of radio frequency reception chains comprising an envelope detection circuit of the type of circuit DET, a bandpass filter of the type of circuit BPF, and an amplification circuit of the type of circuit BBA.

An embodiment of an amplifier implementing not only the amplification function of circuit BAA, but also the bandpass filtering function of circuit BPF, is here provided. In other words, a bandpass amplifier circuit, or in simpler terms, a bandpass amplifier, is here provided.

The provided amplifier thus enables to replace two successive stages implementing one after the other a bandpass filtering function and a function of amplification of an envelope signal, by a single stage simultaneously implementing the filtering function and the function of amplification of the envelope signal of a radio frequency signal. For example, according to an embodiment, the amplifier provided herein replaces the two stages or circuits BBA and BPF of the receiver Rx of FIG. 1.

This decrease in the number of stages in a radio frequency receive chain results in a power consumption decrease. This power consumption decrease is, for example, particularly advantageous for wake up radio frequency receivers. Indeed, wake up radio receivers are configured to detect, over a radio frequency band of interest, whether a wake up signal is transmitted, and, for this purpose, continuously listen or observe the band of interest.

Figure 2:
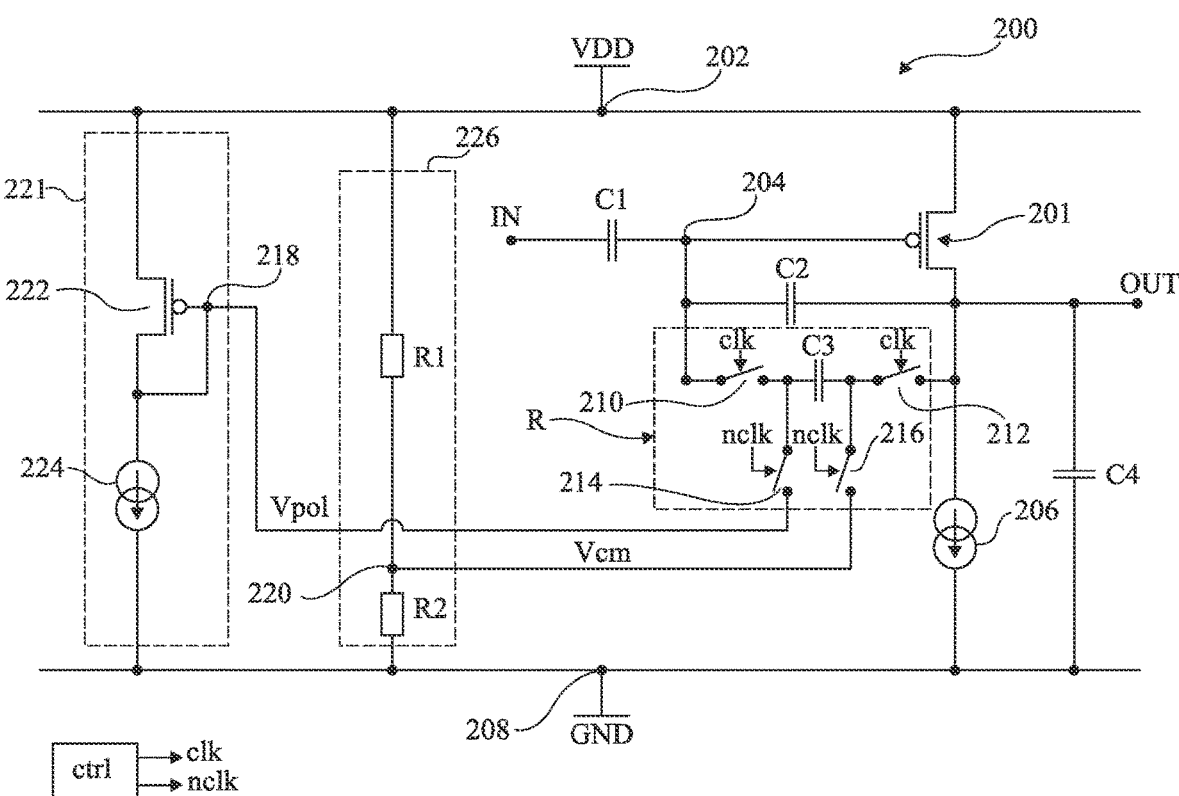
FIG. 2 shows an embodiment of a bandpass amplifier.

FIG. 2 shows an embodiment of a bandpass amplifier circuit 200.

Amplifier 200 comprises a MOS ("Metal Oxide Semiconductor") transistor 201. In the example of FIG. 2, transistor 201 is a PMOS transistor, that is, a P-channel MOS transistor.

The source of transistor 201 is configured to receive a power supply potential VDD. For example, the source of transistor 201 is coupled, preferably connected, to a node 202 configured to receive potential VDD. Potential VDD is for example referenced to a reference potential, for example, ground GND. As an example, potential VDD is positive. Potentials VDD and GND respective correspond to first and second power supply potentials.

The drain of transistor 201 is connected to an output OUT of circuit 200. As an example, output OUT is coupled, for example connected, to a circuit of quantization over one bit. For example, when amplifier 200 is implemented instead of the circuits BBA and BPF of FIG. 1, the output OUT of amplifier 200 is coupled, for example, connected, to an input of the circuit Q of receiver Rx.

Amplifier 200 comprises a capacitive element C1 connected between an input IN of amplifier 200 and a node 204 of amplifier 200. Node 204 is connected to the gate of transistor 201. In other words, capacitive element C1 is connected between input IN and the gate of transistor 201.

As an example, capacitive element C1 has a first electrode or terminal coupled, preferably connected, to input IN, and a second electrode or terminal coupled, preferably connected, to node 204. As an example, input IN is configured to receive an envelope signal of an amplitude-modulated radio frequency signal. As an example, input IN is coupled to an antenna of a radio frequency receiver, for example, to an output of an envelope detection circuit having an input coupled to this antenna. As an example, when amplifier 200 is implemented instead of the circuits BBA and BPF of FIG. 1, the input IN of amplifier 200 is coupled, for example, connected, to the output 102 of the detector DET of receiver Rx.

Amplifier 200 comprises a current source 206. Current source 206 is configured to supply a constant current, the value of this constant current being for example controllable. Current source 206 couples the drain of transistor 201, that is, output OUT, to a node 208 configured to receive a reference potential, in this example ground GND. For example, current source 206 has a first terminal coupled, preferably connected, to the drain of transistor 201, and a second terminal coupled, preferably connected, to node 208.

Amplifier 200 further comprises a resistive element R and a capacitive element C2. Elements R and C2 are connected in parallel to each other, between node 204 (gate of transistor 201) and output OUT (drain of transistor 201). Resistive element R is implemented by a switched capacitor. In other words, resistive element R comprises the switched capacitor, for example, is formed by the switched capacitor.

The use of a switched capacitor to implement resistive element R enables to obtain high resistance values, for example, greater than 1 Gohm, for example, in the order of 10 Gohm, while keeping a decreased bulk.

The use of a switched capacitor to implement resistive element R further enables to control the resistance value of resistive element R, which enables to control the low cutoff frequency of the bandpass filtering function of amplifier 200. As a result, the DC ("Direct Current") component on input IN is filtered by amplifier 200 and cannot be found on the output OUT thereof.

Further, the use of a switched capacitor to implement resistive element R enables to set to a target value the common-mode voltage on the output OUT of amplifier 200. Preferably, the output common mode, that is, the common-mode voltage on output OUT, is set to half the value of power supply potential VDD, which enables to use the entire dynamic range available for the output signal of amplifier 200.

According to an embodiment, resistive element R comprises a switch 210, a capacitive element C3, and a switch 212. Switch 210, capacitive element C3 and switch 212 are series-connected, in this order, between the gate 204 of transistor 201 and the drain OUT of transistor 201. For example, switch 210 is connected between node 204 and a first electrode or terminal of capacitive element C3, and switch 212 is connected between node OUT and a second electrode or terminal of capacitive element C3. For example, switch 210 has a conduction terminal connected to node 204 and another conduction terminal connected to capacitive element C3, switch 212 having a conduction terminal connected to element C3 and another conduction terminal connected to node OUT.

The two switches 210 and 212 are controlled in phase. In other words, when switch 210 is on, respectively off, switch 212 is on, respectively off. Switches 210 and 212 are controlled by a control signal clk, for example, delivered by a control circuit ctrl.

Signal clk is a periodic signal having its frequency determining the resistance value Rval of the resistive element. Indeed, the resistance value Rval of resistive element R between nodes 204 and OUT is equal to 1/(Fclk*C3val), Fclk being the frequency of signal clk and C3val the capacitance value of capacitive element C3. As an example, capacitive element C3 is implemented by a metal-oxide-metal (MOM) capacitive element. Indeed, a MOM capacitive element has a specific capacitance value, which enables to obtain a specific resistance value Rval.

Due to the fact that frequency Fclk determines value Rval, frequency Fclk also determines the low cutoff frequency Flow of amplifier 200. Indeed, frequency Flow is equal to $1/(2*\text{Å}*C2val*Rval)$, and thus to $(Fclk*C3val)/(2*\Pi*C2val)$, C2val being the capacitance value of capacitive element C2, the ratio of values C3val/C2val being for example very well controlled, for example, by implementing each of elements C2 and C3 with a metal-oxide-metal capacitor.

Thus, frequency Flow may be controlled by frequency Fclk, a change in frequency Fclk causing a corresponding change of frequency Flow.

Further, a gain G of amplifier 200 is equal to C1val/C2val, C1val being the capacitance value of capacitive element C1. Thus, gain G may be relatively high, for example, in the order of 30 dB. Preferably, capacitive elements C1 and C2 are each implemented by a metal-oxide-metal capacitive element, which enables to obtain a specific gain value G.

According to an embodiment, resistive element R further comprises a switch 214 and a switch 216. Switch 214 is connected between a node 218 and the first electrode or terminal of capacitive element C3. In other words, switch 214 is connected between node 218 and the node of connection of switch 210 to capacitive element C3. Switch 216 is connected between a node 220 and the second electrode or terminal of capacitive element C3. In other words, switch 216 is connected between node 220 and the node of connection of switch 212 to capacitive element C3. For example, switch 214 has a conduction terminal connected to the first terminal of capacitive element C3 and another conduction terminal connected to node 218, switch 216 having a conduction terminal connected to the second terminal of element C3 and another conduction terminal connected to node 220.

The two switches 214 and 216 are controlled in phase with respect to each other, and in phase opposition with respect to switches 210 and 212. In other words, when switches 210 and 212 are on, respectively off, switches 214 and 216 are off, respectively on. Switches 214 and 216 are controlled by a control signal nclk, for example delivered by circuit ctrl. As an example, signal nclk is the complementary of signal clk, that is, signal nclk is in a high, respectively low, binary state, when signal clk is in a low, respectively high, binary state. As an alternative example, signal nclk may be different from the complementary signal clk, to ascertain that switches 214 and 216 and switches 210 and 212 are never on at the same time.

Node 218 is configured to receive a bias potential Vpol. Potential Vpol imposes the bias potential, that is, the DC potential, on node 204, and thus on the gate of transistor 201.

According to an embodiment, node 218 forms part of a circuit 221 configured to deliver potential Vpol to node 218 to impose the DC potential to the gate 204 of transistor 201.

According to an embodiment, circuit 221 comprises a MOS transistor 220, in this example with a P channel, and node 218 corresponds to the gate of MOS transistor 222 or, in other words, node 218 is connected to the gate of transistor 222. The source of transistor 222 is configured to receive potential VDD. The source of transistor 222 is thus coupled, preferably connected, to node 202. The drain of transistor 222 is connected to node 218, that is, to the gate 218 of transistor 222. The drain of transistor 222 is further coupled to node 208 by a current source 224. For example, current source 224 has a terminal coupled, preferably connected, to node 208, and another terminal coupled, preferably connected, to the drain (node 218) of transistor 222. It will be within the abilities of those skilled in the art to size current source 224 and transistor 222 to determine a value of potential Vpol, and thus a value of the DC potential of node 204. For example, current source 224 is configured to deliver the same current value as current source 206, and transistors 222 and 201 have the same dimensions.

As an example, current source 224 is implemented by a MOS transistor and current source 206 is implemented by another MOS transistor, these two MOS transistors being assembled as a mirror of the same other MOS transistor. As an example, these MOS transistors are N-channel MOS or NMOS transistors.

Node 220 is configured to receive a bias potential Vcm. The output common-mode value of amplifier 200 is determined by the value of potential Vcm, for example is equal to the value of potential Vcm.

According to an embodiment, node 220 forms part of a circuit 226 configured so that the potential Vcm of node 220 is equal to a target common-mode output value of amplifier 200.

According to an embodiment, circuit 226 is a voltage dividing bridge connected between nodes 202 and 208, node 220 being an intermediate node of voltage dividing bridge 226. For example, dividing bridge 226 comprises two resistive elements R1 and R2 series-connected between nodes 202 and 208, and connected to each other at the level of node 220, elements R1 and R2 having the same resistance value.

When switches 214 and 216 are on (switches 210 and 212 off), the potential difference across capacitive element C3 is equal to the difference between potentials Vpol and Vcm. When switches 214 and 216 switch to the off state, switches 210 and 212 switch to the on state, whereby the potential difference across capacitive element C3 is between nodes 204 and OUT. Due to the fact that potential Vpol is equal to the DC potential of node 204, the DC potential of node OUT is then equal to potential Vcm. The amplifier 200 of FIG. 2 thus enables to control the output common-mode voltage OUT of amplifier 200 without using a feedback loop which would be complex and bulky to implement.

Amplifier 200 further comprises, for example, a capacitive element C4, for example called output capacitive element C4. Capacitive element C4 is connected between output OUT (drain of transistor 201) and node 208 at ground potential GND. Capacitive element C4 contributes to filtering high frequencies on output OUT, that is, frequencies higher than the high cutoff frequency of amplifier 200. Indeed, the high cutoff frequency Fhight of bandpass amplifier 200 is equal to:

$$(gm*(C2val/C1val))/(2*Å*(C2val+C4val+ (C2val*C4val)/C1val)),$$

C4val being the capacitance value of capacitive element C4 and gm being the transconductance value of transistor 201. In other words, frequency Fhight is equal to:

$$gm/(2*Å*G*(C2val+C4val+C4val/G)).$$

As an example, capacitive element C4 is implemented by a capacitive element MOM.

Amplifier 200 enables to amplify the envelope signal received on input IN while suppressing disturbances present in the envelope signal which have frequencies greater than frequency Fhight, by suppressing the DC component of the envelope signal supplied to input IN and by setting the common-mode voltage on output OUT.

As an example of application, in the case where capacitance value C1val is equal to 8 pF, capacitance value Caval is equal to 240 fF plus a 25-fF stray capacitance, capacitance value C4val is equal to 1 pF, resistance value Rval is equal to 10 Gohms, and the transconductance of transistor 201 is equal to 5.3 μS, gain G has a theoretical 29.6-dB value, frequency Flow has a theoretical 60-Hz value, and frequency Fhigh has a theoretical 3-kHz value. Simulations have been performed by means of the simulation tool designated by trade name Cadence with the same values C1val, C2val, C4val, and Rval as indicated hereabove. The simulated values of gain G, of frequency Flow, and of frequency Fhight are then respectively equal to 29.5 dB, 60 Hz, and 2.8 kHz, which is in accordance with the above indicated theoretical values. Further, for the values C1val, C2val, C4val, and Rval indicated hereabove, the simulations have shown that the power consumption of amplifier 200 is equal to 200 nA, and that the surface area occupied by amplifier 200 is in the order of 100 μm*100 μm.

According to an embodiment, amplifier 200 is implemented in a radio frequency receiver, preferably in a wake up radio receiver comprising an envelope detection circuit having an input coupled to an antenna of the radio frequency receiver and an output coupled, for example, connected, to the input IN of amplifier 200. The output OUT of amplifier 200 is for example coupled, preferably connected, to a circuit of quantization over one bit. Preferably, the radio frequency receiver is configured to receive a radio frequency signal which is amplitude-modulated, preferably in all or nothing, for example according to a Manchester coding. As an example, amplifier 200 replaces the two circuits or stages BBA and BPF in the receiver Rx of FIG. 1.

However, those skilled in the art are capable of implementing amplifier 200 in radio frequency receivers different from that described in relation with FIG. 1.

For example, amplifier 200 may be provided in a radio frequency receiver to amplify an envelope signal of a radio frequency signal amplitude modulated otherwise than with a Manchester coding, or even otherwise than in all or nothing, and to simultaneously implement a bandpass filtering function, for example, with high and low cutoff frequencies lower than those of known bandpass amplifiers.

More generally, amplifier 200 may be provided in all applications or in all systems where it is desired to implement a signal amplification function and, simultaneously, a bandpass filtering function, for example, with a low cutoff frequency lower than 500 Hz, preferably smaller than or equal to 100 Hz, and/or for example with a decreased power consumption with respect to known circuits enabling to implement these amplification and low-pass filtering functions.

Further, those skilled in the art are capable of adapting the description made hereabove of amplifier 200 to the case where potential VDD is negative with respect to potential GND, for example, by replacing the P-channel, respectively N-channel, MOS transistors with N-channel, respectively P-channel MOS transistors. Those skilled in the art are also capable of inverting the position of current source 206 and of transistor 201, by replacing P-channel transistor 201 with an N-channel transistor and, when potential Vpol is delivered by transistor 222 and current source 224, by replacing P-channel transistor 222 with an N-channel transistor 222 and by inverting the position of current source 224 and of transistor 222.

The case where the drain of transistor 201 corresponds to the output OUT of amplifier 200 has been described hereabove. In other embodiments, the drain of transistor 201 corresponds to an output of a first stage of an amplifier 300, and is coupled to an input of a second stage of amplifier 300.

Figure 3:
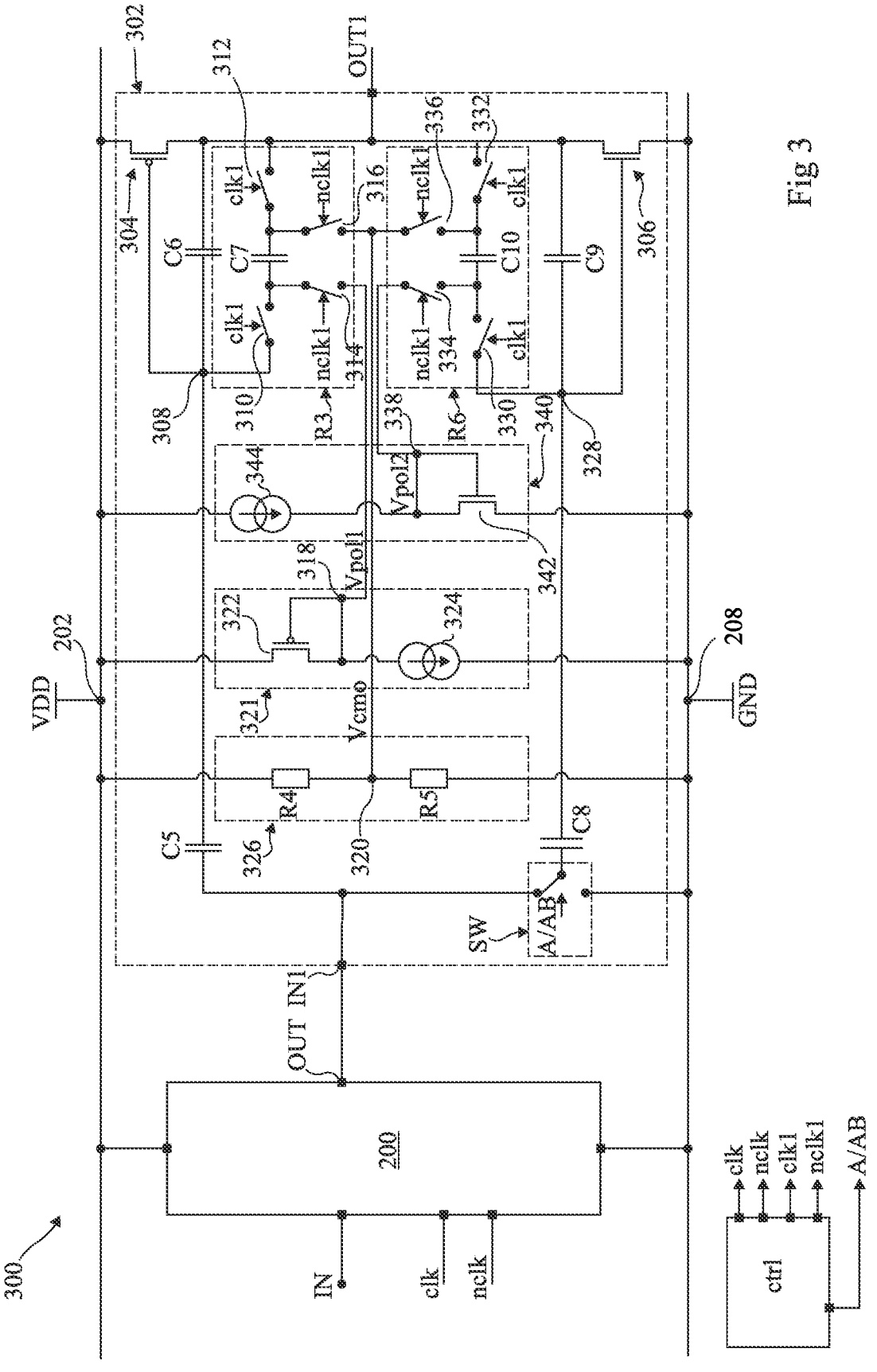
FIG. 3 shows an amplifier according to an embodiment.

FIG. 3 illustrates an example of embodiment of such an amplifier 300.

Amplifier 300 comprises a first stage implemented by the previously-described amplifier 200, first stage 200 being shown in the form of a block in FIG. 3.

Amplifier 300 comprises an input corresponding to the input IN of stage 200 or, in other words, the input of amplifier 300 is coupled, for example, connected, to the input IN of stage 200.

Amplifier 300 further comprises a second stage, or second amplifier, 302, delimited by dotted lines in FIG. 3.

Stage 302 comprises an input IN1. Input IN1 is coupled, for example connected, to the output OUT of stage 200.

Stage 302 comprises an output OUT1. Output OUT1 is coupled, for example connected, to an output of amplifier 300. In this example, the output OUT1 of stage 302 corresponds to the output OUT1 of amplifier 300.

Although this is not illustrated in FIG. 3, a capacitive element may be connected between the output OUT of stage 302 and node 208. This capacitive element is, for example, the capacitive element C4 described in relation with FIG. 2. This capacitive element enables, for example, to determine at least partly the cutoff frequency of the low-pass filtering function implemented between input IN and output OUT1 of amplifier 300.

Amplifier 302 comprises a MOS transistor 304 and a MOS transistor 306. Transistors 304 and 306 are series-connected between nodes 202 and 208. In the example of FIG. 3, transistor 304 is a PMOS transistor, transistor 306 being an NMOS transistor.

The source of transistor 304 is configured to receive power supply potential VDD. For example, the source of transistor 304 is coupled, preferably connected, to node 202.

The drain of transistor 304 is coupled, for example, connected, to the output OUT1 of circuit 302. As an example, output OUT1 is coupled, for example connected, to a circuit of quantization over one bit. For example, when amplifier 300 is implemented instead of the circuits BBA and BPF of FIG. 1, the output of amplifier 300 is coupled, for example connected, to an input of the circuit Q of receiver Rx.

The drain of transistor 304 is further coupled to node 208. More particularly, the drain of transistor 304 is coupled to node 208 by transistor 306.

Amplifier 302 comprises a capacitive element C5 coupling the input IN1 of amplifier 302 and a node 308 of stage 302. Node 308 is connected to the gate of transistor 304. In other words, the gate 308 of transistor 304 is coupled to input IN1 by capacitive element C5.

As an example, capacitive element C5 has a first electrode or terminal coupled, preferably connected, to input IN1, and a second electrode or terminal coupled, for example connected, to node 308.

Amplifier 302 further comprises a resistive element R3 and a capacitive element C6. Elements R3 and C6 are connected in parallel to each other, between node 308 (gate of transistor 304) and the drain of transistor 304 (output OUT1). Like the element R of stage 200 (FIG. 2), resistive element R3 is implemented by a switched capacitor. In other words, resistive element R3 comprises or is formed by a switched capacitor. Element R3 is delimited by dotted lines in FIG. 3.

The use of a switched capacitor to implement resistive element R3 enables to obtain high resistance values, for example, greater than 1 Gohm, for example, in the order of 10 Gohms, while keeping a reduced bulk.

The use of a switched capacitor to implement resistive element R3 further enables to control the resistance value of resistive element R3, which enables to control the low cutoff frequency of the bandpass filtering function of amplifier 302, and thus of amplifier 300.

Further, the use of a switched capacitor to implement resistive element R3 enables to set to a target value the common-mode voltage on the output OUT1 of stage 302, and thus of amplifier 300, for example, to a value equal to half the voltage between nodes 202 and 208.

According to an embodiment, resistive element R3 comprises a switch 310, a capacitive element C7, and a switch 312. Switch 310, capacitive element C7, and switch 312 are series-connected, in this order, between the gate 308 of transistor 304 and the drain OUT1 of transistor 304. For example, switch 310 is connected between node 308 and a first electrode or terminal of capacitive element C7, and switch 312 is connected between the drain of transistor 304 and a second electrode or terminal of capacitive element C7. For example, switch 310 has a conduction terminal connected to node 308 and another conduction terminal connected to capacitive element C7, switch 312 having a conduction terminal connected to element C7 and another conduction terminal connected to the drain of transistor 304.

The two switches 310 and 312 are controlled in phase. In other words, when switch 310 is on, respectively off, switch 312 is on, respectively off. Switches 310 and 312 are controlled by a control signal clk1, for example, supplied by control circuit ctrl.

Signal clk1 is a periodic signal having its frequency determining the resistance value Rval3 of resistive element R3, the latter being equal to $1/(Fclk1*C7val)$, Fclk1 being the frequency of signal clk1 and C7val the capacitance value of capacitive element C7. As an example, capacitive element C7 is implemented by a metal-oxide-metal (MOM) capacitive element. Indeed, a capacitive element MOM has an accurate capacitance value, which enables to obtain an accurate resistance value Rval3.

Due to the fact that frequency Fclk1 determines value Rval3, frequency Fclk1 also at least partly determines the low cutoff frequency of amplifier 300.

Thus, the low cutoff frequency of amplifier 300 may be controlled by frequencies Fclk and Fclk1, a change in one and/or the other of these frequencies causing a corresponding change of this cutoff frequency.

Resistive element R3 further comprises a switch 314 and a switch 316. Switch 314 is connected between a node 318 and the first electrode or terminal of capacitive element C7. In other words, switch 314 is connected between node 318 and the connection node of switch 310 to capacitive element C7. Switch 316 is connected between a node 320 and the second electrode or terminal of capacitive element C7. In other words, switch 316 is connected between node 320 and the connection node of switch 312 to capacitive element C7. For example, switch 314 has a conduction terminal connected to the first terminal of capacitive element C7 and another conduction terminal connected to node 318, switch 316 having a conduction terminal connected to the second terminal of element C7 and another conduction terminal connected to node 320.

The two switches 314 and 316 are controlled in phase with respect to each other, and in phase opposition with respect to switches 310 and 312. In other words, when switches 310 and 312 are on, respectively off, switches 314 and 316 are off, respectively on. Switches 314 and 316 are controlled by a control signal nclk1, for example, supplied by circuit ctrl. As an example, signal nclk1 is the complementary of signal clk1, that is, signal nclk1 is in a high, respectively low, binary state, when signal clk1 is in a low, respectively high, binary state. As an alternative example, signal nclk1 may be different from the complementary of signal clk1, to ascertain that switches 314 and 316 are never on at the same time as switches 310 and 312.

Node 318 is configured to receive a bias potential Vpol1. Potential Vpol1 imposes the bias potential, that is, the DC potential, on node 308, and thus on the gate of transistor 304.

According to an embodiment, node 318 forms part of a circuit 321, delimited in dotted lines in FIG. 3. Circuit 321 is configured to deliver potential Vpol1 to node 318, to impose the DC potential to the gate 308 of transistor 304.

According to an embodiment, circuit 321 comprises a MOS transistor 322, for example, with a channel of the same type as that of transistor 304, and node 318 corresponds to the gate of MOS transistor 322, or, in other words, node 318 is connected to the gate of transistor 322. The source of transistor 322 is, like the source of transistor 304, configured to receive potential VDD. The source of transistor 322 is thus coupled, preferably connected, to node 202. The drain of transistor 322 is connected to node 318. The drain of transistor 322 is further coupled to node 208 by a current source 324. For example, current source 324 has a terminal coupled, preferably connected, to node 208, and another terminal coupled, preferably connected, to the drain (node 318) of transistor 322. Those skilled in the art are capable of sizing current source 324 and transistor 322 to determine a value of potential Vpol1. As an example, current source 324 is implemented by a MOS transistor of a current mirror.

Node 320 is configured to receive bias potential Vcmo. The value of the output common mode of stage 302, and thus of amplifier 300, is determined by the value of potential Vcmo, and is, for example, equal to the value of potential Vcmo. As an example, the value of potential Vcmo is equal to that of potential Vcm (FIG. 2), although in other examples, these values may be different.

According to an embodiment, node 320 forms part of a circuit 326 configured to deliver potential Vcmo at node 320. As an example, when potentials Vcm and Vcmo are equal, circuits 320 and 226 may be implemented by the same circuit, circuits 320 and 226 then being said to be one and the same.

According to an embodiment, circuit 326 is a voltage dividing bridge connected between nodes 202 and 208, node 320 being an intermediate node of voltage dividing bridge 326. For example, dividing bridge 326 comprises two resistive elements R4 and R5 series-connected between nodes 202 and 208, and connected to each other at the level of node 320. Elements R4 and R5 for example have the same resistance value.

The source of transistor 306 is configured to receive potential GND. For example, the source of transistor 306 is coupled, preferably connected, to node 208.

The drain of transistor 306 is connected to the drain of transistor 304. The drain of transistor 306 is coupled, for example, connected, to the output OUT1 of circuit 302. The drain of transistor 306 is further coupled to node 202. More particularly, the drain of transistor 306 is coupled to node 202 by transistor 304.

Amplifier 302 comprises a capacitive element C8 and a switch SW coupling the input IN1 of amplifier 302 and a node 328 of stage 302. Node 328 is connected to the gate of transistor 306. In other words, the gate of transistor 306 is coupled to switch SW by capacitive element C8.

As an example, capacitive element C8 has a first electrode or terminal coupled, preferably connected, to switch SW, and a second electrode or terminal coupled, for example connected, to node 328.

Amplifier 302 further comprises a resistive element R6 and a capacitive element C9. Elements R6 and C9 are connected in parallel with each other, between node 328 (gate of transistor 306) and the drain of transistor 306 (output OUT1). Like the element R of stage 200 (FIG. 2), resistive element R6 is implemented by a switched capacitor. In other words, resistive element R6 comprises or is formed by a switched capacitor. Element R6 is delimited by dotted lines in FIG. 3.

The use of a switched capacitor to implement resistive element R6 enables to obtain high resistance values, for example, greater than 1 Gohm, for example, in the order of 10 Gohms, while keeping a reduced bulk.

The use of a switched capacitor to implement resistive element R6 further enables to control the resistance value of resistive element R6, which enables to control the low cutoff frequency of the bandpass filtering function of amplifier 302, and thus of amplifier 300.

Further, the use of a switched capacitor to implement resistive element R6 enables to set to a target value the common-mode voltage on the output OUT1 of stage 302, and thus of amplifier 300.

According to an embodiment, resistive element R6 comprises a switch 330, a capacitive element Cm, and a switch 332. Switch 330, capacitive element Cm, and switch 332 are series-connected, in this order, between the gate 328 of transistor 306 and the drain OUT1 of transistor 306. For example, switch 330 is connected between node 328 and a first electrode or terminal of capacitive element C10, and switch 332 is connected between the drain of transistor 306 and a second electrode or terminal of capacitive element C10. For example, switch 330 has a conduction terminal connected to node 328 and another conduction terminal connected to capacitive element C10, switch 332 having a conduction terminal connected to element C10 and another conduction terminal connected to the drain of transistor 306.

The two switches 330 and 332 are controlled in phase. In other words, when switch 330 is on, respectively off, switch 332 is on, respectively off. Switches 330 and 332 are controlled by signal clk1.

Signal clk1 determines the resistance value Rval6 of resistive element R6, the latter being equal to 1/(Fclk1*C10val), Fclk1 being the frequency of signal clk1 and C10val the capacitance value of capacitive element Cm. As an example, capacitive element Cm is implemented by a metal-oxide-metal (MOM) capacitive element. Indeed, a capacitive element MOM has a precise capacitance value, which enables to obtain a precise resistance value Rval6.

Due to the fact that frequency Fclk1 determines value Rval6, frequency Fclk1 also determines, at least partly, the low cutoff frequency of amplifier 300.

Thus, the cutoff frequency of amplifier 300 may be controlled by frequencies Fclk and Fclk1, a change in one and/or the other of these frequencies causing a corresponding change of this cutoff frequency.

Resistive element R6 further comprises a switch 334 and a switch 336. Switch 334 is connected between a node 338 and the first electrode or terminal of capacitive element Cm. In other words, switch 334 is connected between node 338 and the node of connection of switch 330 to capacitive element Cm. Switch 336 is connected between node 320 and the second electrode or terminal of capacitive element C10. In other words, switch 336 is connected between node 320 and the node of connection of switch 332 to capacitive element C10. For example, switch 334 has a conduction terminal connected to the first terminal of capacitive element C10 and another conduction terminal connected to node 338, switch 336 having a conduction terminal connected to the second terminal of element C10 and another conduction terminal connected to node 320.

The two switches 334 and 336 are controlled in phase with respect to each other, and in phase opposition with respect to switches 330 and 332. In other words, when switches 330 and 332 are on, respectively off, switches 334 and 336 are off, respectively on. Switches 334 and 336 are controlled by signal nclk1. As an example, signal nclk1 is the complementary of signal clk1, although signal nclk1 may be different from the complementary of signal clk1, to ascertain that switches 334 and 336 and switches 330 and 332 are never on at the same time.

Node 338 is configured to receive a bias potential Vpol2. Potential Vpol2 imposes the bias potential, that is, the DC potential, on node 328, and thus on the gate of transistor 306.

According to an embodiment, node 338 forms part of a circuit 340, delimited in dotted lines in FIG. 3. Circuit 340 is configured to deliver potential Vpol2 to node 338, to impose the DC potential on the gate 328 of transistor 306.

According to an embodiment, circuit 340 comprises a MOS transistor 342, for example, with a channel of the same type as that of transistor 306, and node 338 corresponds to the gate of MOS transistor 342 or, in other words, node 338 is connected to the gate of transistor 342. The source of transistor 342 is, like the source of transistor 306, configured to receive potential GND. The source of transistor 342 is thus coupled, preferably connected, to node 208. The drain of transistor 342 is connected to node 338, that is, to the gate of transistor 342. The drain of transistor 342 is further coupled to node 202 by a current source 344. For example, current source 344 has a terminal coupled, preferably connected, to node 202, and another terminal coupled, preferably connected, to the drain (node 338) of transistor 342. Those skilled in the art are capable of sizing current source 344 and transistor 342 to determine a value of potential Vpol2. As an example, current source 344 is implemented by a MOS transistor of a current mirror.

Switch SW is configured to couple the gate 328 of transistor 306 and, more exactly, capacitive element C8, selectively to input IN1 or to node 208. Switch SW is controlled by a control signal A/AB. As an example, signal A/AB is a binary signal having a first binary state controlling the coupling of the gate 328 of transistor 306 to input IN1, and having a second binary state controlling the coupling of gate 328 of transistor 306 to node 208. As an example, switch SW has an input coupled to node 328, a first output coupled, preferably connected, to node 208, a second output coupled, preferably connected, to input IN1, and a control input configured to receive signal A/AB. As an example, signal A/AB is supplied by circuit ctrl.

Stage 302 is a class-A amplifier when switch SW couples the gate 328 of transistor 306 to node 208, and a class-AB amplifier when switch SW couples the gate 328 of transistor 306 to input IN1. When stage 302 is controlled in class A, respectively AB, amplifier 300 is a class-A, respectively -AB amplifier.

As an example, stage 302 is controlled in class A for applications privileging a cutoff frequency of the low-pass function between input IN and output OUT1 which is the lowest possible, with respect to the maximal slope ("slew-rate") of the signal available on output OUT1. Conversely, stage 302 is controlled in class AB for applications privileging the maximum slope of the signal on output OUT1 with respect to the obtaining of as low as possible a low-pass cutoff frequency.

In the example of FIG. 3, switch SW is coupled to the gate 328 of transistor 306 which has its source configured to receive potential GND, and switch SW is configured to couple gate 328 and, more particularly, capacitive element C8, selectively to node 208 or to input iN1. In another example not shown, switch SW is coupled to the gate 308 of transistor 304 which has its source configured to receive potential VDD, and switch SW is then configured to couple gate 308 and, more particularly, capacitive element C5, to node 202 or to input IN1. In this case, switch SW has, for example, its input coupled to node 308, its first output coupled, preferably connected, to node 202, its second output coupled, preferably connected, to input IN1, and its control input configured to receive signal A/AB.

In the example of FIG. 3, switch SW is configured to couple gate 328 selectively to node 208 or to input IM, and capacitive element C5 is connected to input IN1. In another example, not shown, where switch SW is also configured to couple gate 328 selectively to node 208 or to input IN1, a switch identical to switch SW may be provided between capacitive element C5 and input IM, and be controlled to maintain gate 308, and, more particularly, capacitive element C5, coupled to input IN1. This additional switch, identical to switch SW, is currently called dummy switch and enables, for example, to balance the conductive path between input IN1 and node 308 with the conductive path between input IN1 and node 328. Those skilled in the art will be capable of adapting such an example to the case where switch SW is configured to couple node 308 selectively to input IN1 or to node 202 and where the dummy switch then couples node 328 to input IN1.

According to another embodiment, not shown, second stage 302 is replaced with a second stage 200. In this case, second stage 200 is a class-A amplifier, whereby amplifier 300 is a class-A amplifier.

According to still another embodiment, second stage 302 does not comprise switch SW, element C8 then being connected to input IN1. In this case, stage 302, and thus amplifier 300, are fixed in class AB.

Although stage 302 has been disclosed and described as being connected to the rest of stage 200, stage could be omitted by the connection of input IN1 of stage 302 directly to input IN of the amplifier. In other words, stage 302 is an amplifier capable of being used as such, either in fixed class AB when switch SW is omitted, or in class A or class AB selectable by means of signal A/AB.

In the same way as the capacitive element C3 described in relation with FIG. 2, each of capacitive elements C7 and Cm may be implemented with a capacitive element of controllable capacitance value, to be able to control the cutoff frequency of the low-pass filtering function between input IN1 and output OUT1, or, more generally, between input IN and output OUT1.

Preferably, transistors 304 and 306 have similar or identical dimensions, so that the slope during a transition of the signal on output OUT1 from a high state to a low state is similar or identical to the slope during a transition from a low state to a high state. However, one of transistors 304 and 306 may be selected to be larger than the other to favor the rise time or the fall time of a signal on output OUT1.

In the example described hereabove in relation with FIG. 3, the frequency of signals clk and nclk is different from the frequency of signals clk1 and nclk1. In another example, the frequency of signals clk and nclk is the same as that of signals clk1 and nclk1, for example, when signals clk and clk1 correspond to the same signal and signals nclk and nclk1 correspond to the same other signal.

According to an embodiment, amplifier 300 is implemented in a radio frequency receiver, preferably in a wake up radio frequency receiver comprising an envelope detection circuit having an input coupled to an antenna of the radio frequency receiver and an output coupled, for example connected, to the input IN of amplifier 300. The output OUT1 of amplifier 300 is for example coupled, preferably connected, to a circuit of quantization over one bit. Preferably, the radio frequency receiver is configured to receive a radio frequency signal which is amplitude-modulated, preferably in all or nothing, for example according to a Manchester coding. As an example, amplifier 300 replaces the two circuits or stages BBA and BPF in the receiver Rx of FIG. 1.

However, those skilled in the art are capable of implementing amplifier 300 in radio frequency receivers different from that described in relation with FIG. 1.

For example, amplifier 302 may be provided in a radio frequency receiver to amplify an envelope signal of a radio frequency signal amplitude modulated otherwise than with a Manchester coding, or even otherwise than in all or nothing, and to simultaneously implement a bandpass filtering function, for example, with high and low cutoff frequencies lower than those of known bandpass amplifiers.

More generally, amplifier 300 may be provided in all applications or in all systems where it is desired to implement a signal amplification function and, simultaneously, a bandpass filtering function, for example, with a low cutoff frequency lower than 500 Hz, preferably smaller than or equal to 100 Hz, and/or for example with a decreased power consumption with respect to known circuits enabling to implement these amplification and low-pass filtering functions.

Various embodiments and variants have been described. Those skilled in the art will understand that certain features of these various embodiments and variants may be combined, and other variants will occur to those skilled in the art. In particular, those skilled in the art are capable of adapting the description made hereabove of amplifier 302 to the case where potential VDD is negative with respect to potential GND, for example, by replacing the P-channel, respectively N-channel, MOS transistors, with N-channel, respectively P-channel, MOS transistors.

Further, the embodiments are not limited to the described examples of circuits 221, 226, 326, 321, and 340, and those skilled in the art will be capable of providing other implementations for these circuits, for example by replacing at least one of these circuits with a constant voltage source delivering the same constant potential as the circuit that it replaces.

Finally, the practical implementation of the described embodiments and variations is within the abilities of those skilled in the art based on the functional indications given hereabove. In particular, the implementation of the switches of the described switched capacitors is within the abilities of those skilled in the art, for example, by implementing each of these switches with a MOS transistor.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. An amplifier comprising:
a first MOS transistor having a drain connected to an output of the amplifier and a source coupled to a first node configured to receive a first power supply potential, the first power supply potential being a positive voltage;
a first capacitive element connected between an input of the amplifier and a gate of the first MOS transistor;
a first current source connecting the drain of the first MOS transistor to a second node configured to receive a second power supply potential; and
a resistive element and a second capacitive element connected in parallel between the gate and the drain of the first MOS transistor, the resistive element comprising a switched capacitor.

2. The amplifier according to claim 1, wherein the resistive element comprises:

a first switch connected between the gate of the first MOS transistor and a first electrode of a third capacitive element, and
a second switch connected between a second electrode of the third capacitive element and the drain of the first MOS transistor.

3. The amplifier according to claim 2, wherein the first and second switches are controllable in phase with respect to each other, and wherein a switching frequency of the first and second switches determines a low cutoff frequency of the amplifier.

4. The amplifier according to claim 1, further comprising a capacitive output element connected between the output of the amplifier and the first node.

5. The amplifier according to claim 1, wherein the amplifier is a bandpass amplifier.

6. The amplifier according to claim 1, wherein a gain of the amplifier is equal to a ratio of a capacitance value of the first capacitive element and a capacitance value of the second capacitive element.

7. The receiver according to claim 6, wherein the receiver is a wake up radio frequency receiver.

8. The receiver according to claim 6, wherein the receiver is configured to receive an amplitude modulated radio frequency signal.

9. A radio frequency receiver comprising:
an envelope detection circuit having an input coupled to an antenna of the receiver and an output coupled to the input of the amplifier according to claim 1.

10. The amplifier according to claim 1, further comprising a capacitive output element connected between the output of the amplifier and the first node.

11. An amplifier comprising:
a first MOS transistor having a drain connected to an output of the amplifier and a source coupled to a first node configured to receive a first power supply potential;
a first capacitive element connected between an input of the amplifier and a gate of the first MOS transistor;
a first current source connecting the drain of the first MOS transistor to a second node configured to receive a second power supply potential, the second power supply potential being a ground; and
a resistive element and a second capacitive element connected in parallel between the gate and the drain of the first MOS transistor, the resistive element comprising a switched capacitor comprising:
a first switch connected to the gate of the first MOS transistor and to a first electrode of a third capacitive element;
a second switch connected to a second electrode of the third capacitive element and to the drain of the first MOS transistor;
a third switch connected to the first electrode of the third capacitive element and to a third node configured to receive a first bias potential; and
a fourth switch connected to the second electrode of the third capacitive element and to a fourth node configured to receive a second bias potential.

12. The amplifier according to claim 11, wherein the third node is a gate of a second MOS transistor having a source configured to receive the first power supply potential, and wherein a drain of the second MOS transistor is connected to the third node and coupled to the second node by a second current source.

13. The amplifier according to claim 12, wherein the first and second MOS transistors and the first and second current sources are configured so that the first bias potential imposes a DC potential on the gate of the first MOS transistor.

14. The amplifier according to claim 13, wherein the first current source comprises a third MOS transistor mirror-assembled with a fourth MOS transistor, and wherein the second current source comprises a fifth MOS transistor mirror-assembled with the fourth MOS transistor.

15. The amplifier according to claim 12, wherein the first and second MOS transistors are NMOS transistors.

16. The amplifier according to claim 11, further comprising a circuit configured to control the first and second switches in phase opposition with respect to the third and fourth switches.

17. The amplifier according to claim 16, wherein the circuit is configured to provide a frequency that determines a resistance value of the resistive element.

18. The amplifier according to claim 16, wherein the circuit is configured to provide a frequency that determines a low cutoff frequency of the amplifier.

19. The amplifier according to claim 11, wherein the second bias potential determines a common-mode output voltage of the amplifier.

20. The amplifier according to claim 11, wherein the second bias potential is equal to half a difference between the first and second power supply potentials.

21. The amplifier according to claim 11, wherein the fourth node is an intermediate node of a voltage dividing bridge connected between the first and second nodes.

22. An amplifier comprising:
a first MOS transistor having a source coupled to a first node configured to receive a first power supply potential;
a second MOS transistor having a source coupled to a second node configured to receive a second power supply potential,
wherein drains of the first and second MOS transistors are connected together and to an output of the amplifier;
a first resistive element and a first capacitive element connected in parallel between a gate and the drain of the first MOS transistor, the first resistive element comprising a first switched capacitor comprising:
a first switch connected between the gate of the first MOS transistor and a first electrode of a second capacitive element;
a second switch connected between a second electrode of the second capacitive element and the drain of the first MOS transistor;

a third switch connected between the first electrode of the second capacitive element and a third node configured to receive a first bias potential; and
a fourth switch connected between the second electrode of the second capacitive element and a fourth node configured to receive a second bias potential; and
a third resistive element and a third capacitive element connected in parallel between a gate and the drain of the second MOS transistor, the third resistive element comprising a second switched capacitor comprising:
a fifth switch connected between the gate of the second MOS transistor and a first electrode of a fourth capacitive element;
a sixth switch connected between a second electrode of the fourth capacitive element and the drain of the second MOS transistor;
a seventh switch connected between the first electrode of the fourth capacitive element and a fifth node configured to receive a third bias potential; and
an eighth switch connected between the second electrode of the fourth capacitive element and the fourth node.

23. The amplifier according to claim 22, wherein the first, second, fifth and sixth switches are controlled by first signals, wherein the third, fourth, seventh and eighth switches are controlled by second control signals, and wherein a frequency of the first control signals is different from a frequency of the second control signals.

24. The amplifier according to claim 22, further comprising:
a first bias circuit configured for providing the first bias potential to the third node, the first bias circuit comprising:
a third MOS transistor having a source coupled to the first node, a gate connected to a drain of the third MOS transistor, wherein the drain of the third MOS transistor is connected to the third node; and
a second current source connecting the drain of the third MOS transistor to the second node; and
a second bias circuit configured for providing the third bias potential to the fifth node, the second bias circuit comprising:
a fourth MOS transistor having a source coupled to the second node, a gate connected to a drain of the fourth MOS transistor, wherein the drain of the fourth MOS transistor is connected to the fifth node; and
a third current source connecting the drain of the fourth MOS transistor to the first node.

* * * * *